United States Patent [19]
Matsuura

[11] Patent Number: 5,619,169
[45] Date of Patent: Apr. 8, 1997

[54] VARIABLE GAIN DIFFERENTIAL AMPLIFIER

[75] Inventor: Satoshi Matsuura, Tokyo, Japan

[73] Assignee: Ando Electric Co., Ltd., Tokyo, Japan

[21] Appl. No.: 526,884

[22] Filed: Sep. 12, 1995

[30] Foreign Application Priority Data

Sep. 30, 1994 [JP] Japan ..................... 6-261735

[51] Int. Cl.⁶ ........................................... H03F 3/45
[52] U.S. Cl. ................................................ 330/254
[58] Field of Search ................... 330/252, 254, 330/261

[56] References Cited

U.S. PATENT DOCUMENTS

| | | | |
|---|---|---|---|
| 4,460,872 | 7/1984 | Mattisson | 330/252 |
| 5,185,581 | 2/1993 | Brown | 330/254 |
| 5,406,221 | 4/1995 | Samani et al. | 330/254 |
| 5,420,538 | 5/1995 | Brown | 330/252 |

Primary Examiner—Steven Mattola
Attorney, Agent, or Firm—Flynn, Thiel, Boutell & Tanis, P.C.

[57] ABSTRACT

A differential amplifier having a largely variable range of output amplitude. The differential amplifier includes first and second transistors respectively having emitters connected to a first constant current source. A third transistor having a base and a collector connected to a base and a collector of the first transistor respectively. The differential amplifier further includes a fourth transistor having a base and collector connected to a base and collector of the second transistor respectively. The differential amplifier further includes resistors respectively connecting the collectors of the first and second transistors to a voltage source; and a second constant current source connected to emitters of the third and fourth transistors. An amplitude control circuit controls the current sources in response to an input signal so as to vary the output amplitude while maintaining the desired frequency characteristics of the differential amplifier.

13 Claims, 3 Drawing Sheets

VARIABLE GAIN DIFFERENTIAL AMPLIFIER

BACKGROUND OF THE INVENTION

1. Field of the Invention

The present invention relates to an amplitude variable type differential amplifier capable of varying an output level or amplitude.

2. Prior Art

In a logical circuit for outputting two voltage levels, i.e. H and L levels, there has been employed an amplitude variable type differential amplifier capable of varying output amplitude such as H and L levels.

The prior art differential amplifier will be now described with reference to FIGS. 6 to 8. FIG. 6 is an amplitude variable type differential amplifier comprising a pair of transistors, FIG. 7 is an amplitude variable type differential amplifier comprising two pairs of transistors, and FIG. 8 is a circuit diagram of an example of a constant current source employed by the amplitude variable type differential amplifier in FIGS. 6 and 7.

In FIG. 6, denoted at 1 is a positive-phase input terminal, 1' is a negative-phase input terminal, 2 and 2' are transistors, 3 and 3' are load resistors having resistance value $R_c$. Denoted at 4 is a constant current source having a current value $I_E$ for emitters of the transistors 2 and 2', and 5 is a power source having a voltage value of $V_{cc}$, 6 is a positive-phase output terminal and 6' is a negative-phase output terminal.

In FIG. 7, denoted at 2a, 2a', 2b, and 2b' are respectively transistors for constituting the differential amplifier. In the differential amplifier of FIG. 7, transistors 2a and 2b correspond to the transistor 2 of FIG. 6, wherein a base, an emitter and a collector of the transistor 2a are respectively connected in parallel with those of the transistor 2b, and transistors 2a' and 2b' correspond to the transistor 2' of FIG. 6, wherein a base, an emitter and a collector of the transistor 2a' are respectively connected in parallel with those of the transistor 2b'. Other elements in FIG. 7 are the same as those in FIG. 6.

In FIG. 8, denoted at 7 is a constant current value setting voltage input terminal, 8 is a constant current output, 9 is a transistor, 10 is a resistor having a resistance value $R_E$, 11 is a constant voltage source having a voltage value $V_{EE}$. Briefly explaining, suppose that a base current can be ignored and an emitter current and a collector current are same in value.

In FIG. 6, logical voltages having phases which are inverted with each other are applied to the positive-phase input terminal 1 and the negative-phase input terminal 1'. Supposing that the voltage applied to the positive-phase input terminal 1 is H level, and the voltage applied to the negative-phase input terminal 1' is L level, the transistor 2 is turned on and the transistor 2' are turned off. As a result, the current $I_E$ which is the same as the current value of the constant current source 4 flows in the collector of the transistor 2, so that the negative-phase output terminal 6' takes the value expressed as $V_{CC}-R_C \times I_E$, namely, it goes L level, while the positive-phase output terminal 6 takes the value of $V_{CC}$, namely, it goes H level.

When the voltages of the positive and negative-phase input terminals 1 and 1' are inverted so that the voltage of the positive-phase input terminal 1 goes L level while the voltage of the negative-phase input terminal 1' goes H level, the voltages of the positive-phase and negative-phase output terminals 6 and 6' are also inverted so that the voltage of the negative-phase output terminal 6' goes H level, i.e. $V_{cc}$, while the positive-phase output terminal 6 goes L level, namely, the voltage value expressed as $V_{CC}-R_C \times I_E$. Accordingly, the voltage amplitude $V_P$ at the positive-phase and negative-phase output terminals 6 and 6' takes values expressed by $R_C \times I_E$.

With the arrangement of the amplitude variable type differential amplifier, the H level can be varied by varying the voltage $V_{CC}$ of the power source 5, and the L level can be varied by varying the resistance value $R_C$ of the load resistors 3 and 3' or by varying the current value, namely, the current value $I_E$ of the constant current source 4.

The resistance value $R_C$ can be continuously varied only by moving the variable resistor mechanically by a motor, etc. However, there occurs such a problem that it takes a long time for varying the resistance value and the size of the variable resistor is made large. There occurs another problem in that a circuit employing the variable resistor is inferior in frequency characteristics since the frequency characteristic of the variable resistor do not extend to a high frequency range.

It is also possible to vary discontinuously the resistance value $R_C$ by switching some fixed resistors. In this case, it is necessary to change a circuit configuration by providing a circuit switch such as a relay, etc. in the circuit. Accordingly, the resistance value $R_C$ can be varied at high speed and the circuit switch can be made small sized compared with the mechanical change using the motor, but the switching time and the external dimensions of the circuit switch are still not practically satisfied. Further, since there is no relay which is excellent in frequency characteristic, the circuit employing this relay is inferior in the frequency characteristics.

Whereupon, it is possible to vary an output amplitude by changing a collector current without changing a circuit configuration per se. In this case, it is possible to obtain excellent results in respect of switching time, external dimensions and frequency characteristic. Accordingly, the L level is normally varied by varying the collector current.

If the circuit as shown in FIG. 8 is employed as the constant current source 4, the current value of the constant current source 4 can be easily controlled by a voltage to be applied to the constant current value setting voltage input terminal 7. As a result, the output amplitude $V_P$ can be controlled.

If the resistance value $R_C$ of the load resistors 3 and 3' is made large, a large amplitude can be obtained by a small amount of collector current, and a large amplitude variation can be made with a slight change of the collector current value. Further, there is an advantage that the less the current flows, the less the power is consumed.

However, although the necessary current may be small when the output amplitude $V_P$ is large, the collector current is made very small for a small amplitude. Since the operating speed of the transistor is greatly reduced when the collector current is small, a high speed signal can not be amplified in case of obtaining the small amplitude. Conversely speaking, the minimum collector current, i.e. minimum output amplitude is determined depending on a degree of amplification of the high speed signal.

On the other hand, if the resistance value $R_C$ of the load resistors 3 and 3' is made small, the reduction of the operating speed can be prevented, but consumption power in the circuit is made large since the value of current flowing in the circuit to obtain a large amplitude is made large. Further, since the transistor is destroyed when the very large collector current flows therethrough, the large amplitude can not be obtained when the resistance value $R_C$ is small. As mentioned above, the resistance value $R_C$ of the load resistors 3 and 3' can be made neither very large nor very small.

That is, the maximum value of the output amplitude $V_P$ is determined by the maximum collector current of the transistors 2 and 2', and the minimum value of the output amplitude $V_P$ is determined by the allowable degree of speed production which is caused by the reduction of the collector current of the transistors 2 and 2'. If the maximum value of the output amplitude $V_P$ is further increased, the differential amplifiers may be connected in parallel with each other.

Described next is a prior art circuit configuration wherein the differential amplifier comprising the transistors 2a and 2a' and the differential amplifier comprising the transistors 2b and 2b' are respectively connected in parallel with each other as shown in FIG. 7. In FIG. 7, since two circuits are connected in parallel with each other, it is possible to flow a current that is twice as large as the current flowing in the circuit of FIG. 6. Accordingly, it is possible to obtain the output amplitude $V_P$ to the extent that is twice as large as that in FIG. 6. Since the high speed transistor is generally small in its maximum collector current, it is impossible to manufacture the high speed circuit which is large in the amplitude variation unless the circuits are connected in parallel with each other.

When the differential amplifiers are connected in parallel with each other, it is possible to obtain the maximum output voltage amplitude by multiplying that of each amplifier and the number of parallel connections of the differential amplifiers. However, in the prior art circuit configuration, since the maximum and minimum amplitudes can be determined by the value of current flowing in one transistor, the minimum output voltage amplitude is increased to an extent that is several times as large as the number of parallel connections of the differential amplifiers, which generates a problem in that the variable range of an output amplitude can not be made large.

SUMMARY OF THE INVENTION

It is an object of the invention to provide a high speed amplitude variable type differential amplifier capable of having a large and variable range of an output amplitude.

To achieve the object, a first aspect of the invention has a first switching element having an input terminal, an output terminal and a control terminal, a second switching element having an input terminal, an output terminal and a control terminal, a first constant current source 4a connected to output terminals of the first and second switching elements, a third switching element having an input terminal, an output terminal and a control terminal, wherein the control terminal is connected to the control terminal of the first switching element, and the input terminal is connected to the first switching element, a fourth switching element having an input terminal, an output terminal and a control terminal, wherein the control terminal is connected to the control terminal of the second switching element, and the input terminal is connected to the second switching element, resistors connected between the input terminals of the first and second switching elements and a voltage source, and a second constant current source connected to output terminals of the third and fourth switching elements.

Current values of the first and second constant current sources are independently controlled to generate a desired output amplitude of the differential amplifier.

Npn-type transistors are employed as the first, second, third and fourth switching elements.

The first and second switching elements or the third and fourth switching elements are plural in number and these switching elements are connected to the first and second constant current sources.

With the arrangement of the differential amplifier, the output amplitude of the differential amplifier can be varied by controlling the current values of the first and second constant current sources. As a result, the variable range of the output amplitude can be made large so as to achieve the high speed differential amplifier.

PREFERRED EMBODIMENT OF THE INVENTION

First Embodiment (FIG. 1 to 3):

A differential amplifier according to a first embodiment will be now described with reference to FIGS. 1 to 3.

Figure 1:
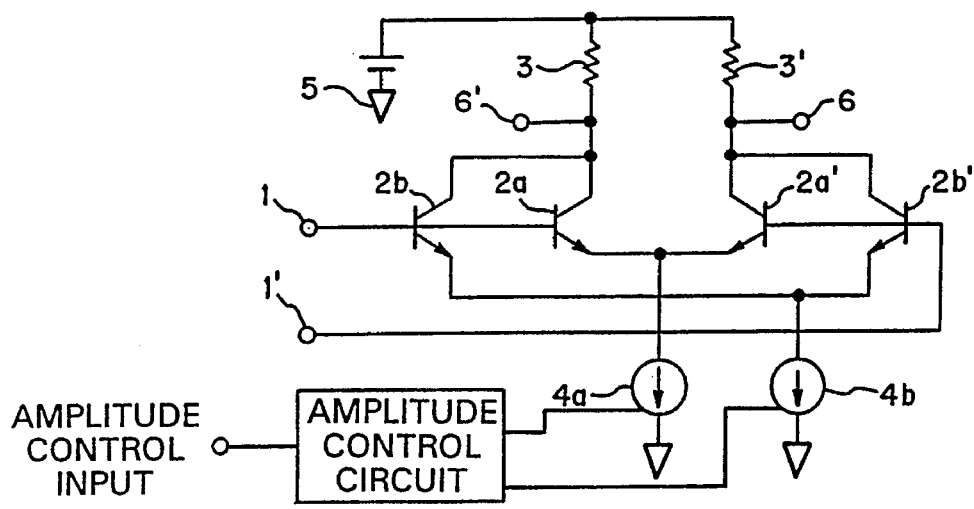
FIG. 1 is a circuit diagram of a differential amplifier according to a first embodiment of the invention.
Figure 7:
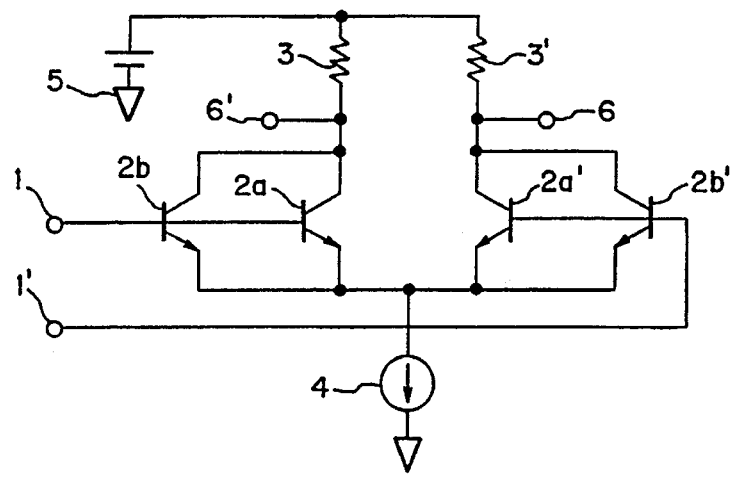
FIG. 7 is a circuit diagram of another prior art amplitude variable type differential amplifier.
Figure 8:
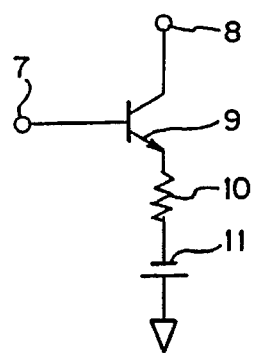
FIG. 8 is a circuit diagram of an example of a constant current source employed by the amplitude variable type differential amplifier in FIGS. 6 and 7.

FIG. 1 shows a differential amplifier with two differential amplifiers. The differential amplifier circuits as shown in FIG. 1 includes a constant current source 4a having an output current value $I_{E1}$ and a constant current source 4b having an output current value $I_{E2}$ instead of the constant current source 4 of the prior art circuit in FIG. 7. The constant current source 4a is connected to emitters of the transistors 2a and 2a', and the constant current source 4b is connected to emitters of the transistors 2b and 2b'. Other elements are the same as those of the differential amplifier in FIG. 7.

Figure 2:
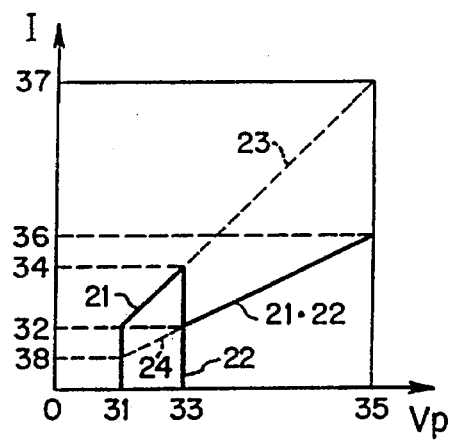
FIG. 2 is a graph showing the relation between a voltage amplitude in an output terminal and an output current of a constant current source in the circuit of FIG. 1.

The relation between the output amplitude $V_P$ at the output terminals 6 and 6' and the output current values $I_{E1}$ and $I_{E2}$ of the constant current sources 4a and 4b are shown in FIG. 2.

In FIG. 2, an abscissa represents the output amplitude $V_P$ and an ordinate represents a current value I. Denoted at 21 and 22 are the relations between the output amplitude $V_P$ and the output current values $I_{E1}$ and $I_{E2}$ of the constant current sources 4a and 4b, at 23 is an auxiliary line showing the relation between the constant current source and the output amplitude in case the transistors are not connected in parallel with each other, at 24 is an auxiliary line showing the relation between the constant current source and the output amplitude in case the transistors are simply connected in parallel with each other, at 31 is the minimum value $V_{P0}$ of the output amplitude $V_P$, at 32 is the minimum value of the current flowing in the transistor, at 33 is a value which is twice as large as 31, at 34 is a value which is twice as large as 32, 35 is the maximum value $V_{Pm}$ of the output amplitude, at 36 is the maximum value of the current which flows in the transistor when the output amplitude is the maximum, at 37 is a current value which is necessary to obtain the maximum output amplitude when the transistors are not connected in parallel with each other, and at 38 is a current value which is necessary to obtain the maximum output amplitude in case the transistors are simply connected in parallel with each other.

When the second constant current source 4b in FIG. 1 is turned off, the equation of $I_{E2}=0$ is established, and a current having the current value 32, i.e., $I_{E1}$ establishing the equation of $I_{E0}=V_{P0}/R_C$ flows in the constant current source 4a in order to set a desired output amplitude $V_P$ to 31, i.e. the minimum value $V_{P0}$ of FIG. 2. As a result, the current does not flow in the transistors 2b and 2b' but it flows only in the transistors 2a and 2a'. Accordingly, the amount of current flowing in a single transistor is made large, thereby reducing the decrease of the operating speed of the transistor compared with the current value 38 in the prior art circuit.

Further, if the desired output amplitude $V_P$ is further made larger so that the output current 21 of the constant current source 4a, i.e. output current value $I_{E1}$ reaches the current value 34, i.e. $2*I_{E0}$, the output currents 21 and 22 of the constant current sources 4a and 4b, i.e. the output current values $I_{E1}$ and $I_{E2}$, are set to the current value 32 establishing the equation of $I_{E1}=I_{E2}=I_{E0}$. Further, if the desired output amplitude $V_P$ is made even larger, the output currents 21 and 22 are set to have values establishing the equation of $I_{E1}=I_{E2}=V_P/R_C$, which is kept until they reach the output amplitude value 35, i.e. $V_{Pm}$. This state is the same as the prior art circuit. That is, the value of the current flowing in the transistors which are not connected in parallel with each other becomes a half of the value 23 of the current flowing in the single transistor, namely, the value of the current can be obtained by dividing of the transistor by the number of parallel connections of the transistors.

In such a manner, if the current values of the constant current sources 4a and 4b are controlled to generate the output amplitude, the current flows in one of the differential amplifiers which are connected in parallel with each other when the output amplitude is small. As a result, the differential amplifier resists being influenced by reduction of the of the operating speed of the transistor caused by the small amount of collector current. On the other hand, if the output amplitude is large, a large amount of current can flow into the transistors while it does not exceed the maximum rated value of each transistor since the transistors are connected in parallel with each other.

It is needless to say that there are many methods to control the output current values $I_{E1}$ and $I_{E2}$ of the constant current sources 4a and 4b for obtaining the output amplitude $V_P$. An example of such method will be now described with reference to FIG. 3.

Figure 3:
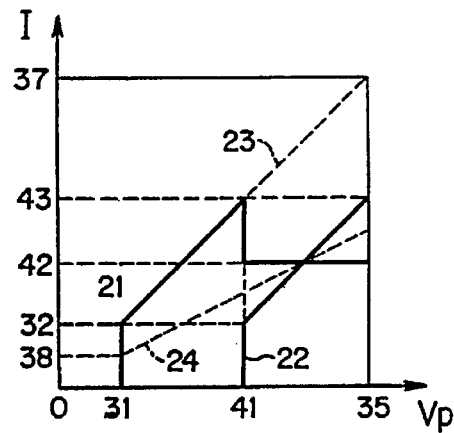
FIG. 3 is a graph showing the relation between a voltage amplitude in an output terminal and an output current of a constant current source in the circuit of FIG. 1.

FIG. 3 shows a relation which is different from that of FIG. 2 by showing the relation between the output amplitude $V_P$ at the output terminals 6 and 6' and the output current values $I_{E1}$ and $I_{E2}$ of the constant current sources 4a and 4b. Denoted at 43 is the maximum value of the current which flows in the transistors, at 41 is the output amplitude when the current flowing in the transistors reaches the maximum value 43 in a state where only one pair of transistors operate, at 42 is a current value which is obtained by subtracting the minimum current 32 from the maximum current 43. Other numerals are the same as those of FIG. 2.

In case of FIG. 3, when the amplitude is small, the current flows in only the transistors 2a and 2a' from the constant current source 4a. If the current of the transistors 2a and 2a' exceeds the predetermined maximum current 43, then the current flows in the transistors 2b and 2b' from the constant current source 4b, supposing that the current flowing in the transistors 2a and 2a' has a fixed value 42. In this control method, the setting for varying the amplitude can be concentrated at either the constant current source 4a or 4b, which simplifies a process for such a setting.

In the differential amplifier according to the first embodiment, the operation for changing the amplitude at the output terminals 6 and 6' from 0.5 V to 5 V will be now described in detail. In FIG. 1, suppose that an ECL level logical (emitter-coupled logic) signal is applied to the input terminal 1 and 1', and the load resistors 3 and 3' have resistance values 100Ω and the power source 5 has a voltage value +5 V. In FIG. 2, denoted at 31 is an output amplitude 0.5 V, 32 is a current value 5 mA, 33 is an output amplitude 1 V, 34 is a current value 10 mA, 35 is an output amplitude 5 V, 36 is a current value 25 mA, and 37 is a current value 50 mA.

The second constant current source 4b is turned off, namely, it has a current value 0A as denoted at 22 in order to set the amplitude at the output terminals 6 and 6' to 31, i.e. 0.5 V. Further, as denoted at 21, the constant current source 4a is set to have, at 32 in FIG. 2, i.e. a current value 5 mA. The transistors 2b and 2b' are respectively turned off.

Supposing that the H level voltage is applied to the positive-phase input terminal 1 and the L level voltage is applied to the negative-phase input terminal 1', the transistors 2b and 2b' are turned off as mentioned above, and a base terminal of the transistor 2a where the L level voltage is applied to is turned off, and the transistor 2a a base terminal of which the H level voltage is applied to is turned on, so that all the current flowing in the constant current source 4a flows in the load resistors 3. Accordingly, 5 V is obtained at the output terminal 6, and the voltage expressed by 5−100×5 mA=4.5 V is obtained at the output terminal 6'. If the H level input voltage is inverted with the L level input voltage, the output voltage is also inverted, so that 4.5 V is obtained at the output terminal 6 and 5 V is obtained at the output terminal 6', so that the output amplitude has a value expressed by 5−4.5=0.5 V.

The constant current sources 4a and 4b are set to have the value 25 mA as denoted at 21 and 22 in order to set the amplitude at the output terminals 6 and 6' to 35, i.e., 5 V. Supposing that the H level voltage is applied to the positive-phase input terminal 1 and the L level voltage is applied to the negative-phase input terminal 1', the transistors 2a' and 2b' base terminals of which the L level voltage is applied to are turned off, and the transistors 2a and 2b base terminals of which the H level voltage is applied to are turned on.

Accordingly, the current which is obtained by adding the current 36 flowing from the transistor 2a to the constant current source 4a, i.e., 25 mA to the current 36 flowing from the transistor 2b to the constant current source 4b, i.e., 50 mA flows in the load resistor 3. As a result, 5 V is obtained at the output terminal 6, and the voltage value expressed by 5–100×(25 mA+25 mA)=0 V is obtained at the output terminal 6'. Further, if the H level input voltage is inverted with the L level input voltage, the output voltage is also inverted, so that the output amplitude has a value expressed by 5–0=5 V.

Figure 4:
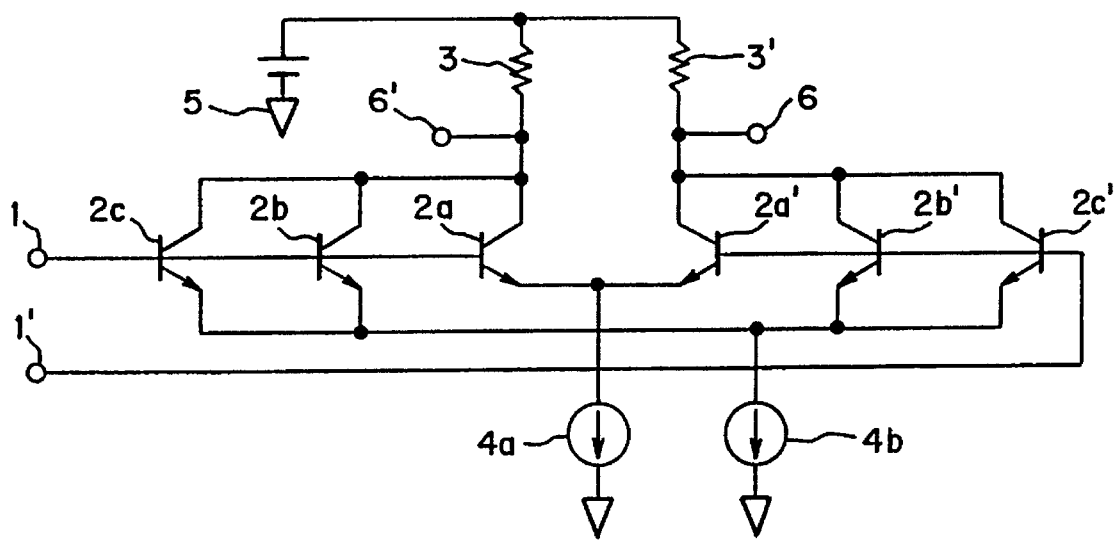
FIG. 4 is a circuit diagram of a differential amplifier according to a second embodiment of the invention.

Second Embodiment (FIGS. 4 and 5):

A differential amplifier according to a second embodiment of the present invention will be now described with reference to FIGS. 4 and 5. In the second embodiment, the differential amplifier has three differential amplifiers and two constant current sources. In FIG. 4, a base, an emitter, a collector of a transistor 2c are connected in parallel with those of the transistor 2b, and a base, an emitter, a collector of a transistor 2c' are connected in parallel with those of the transistor 2b'. Other elements are the same as those of the first embodiment.

Figure 5:
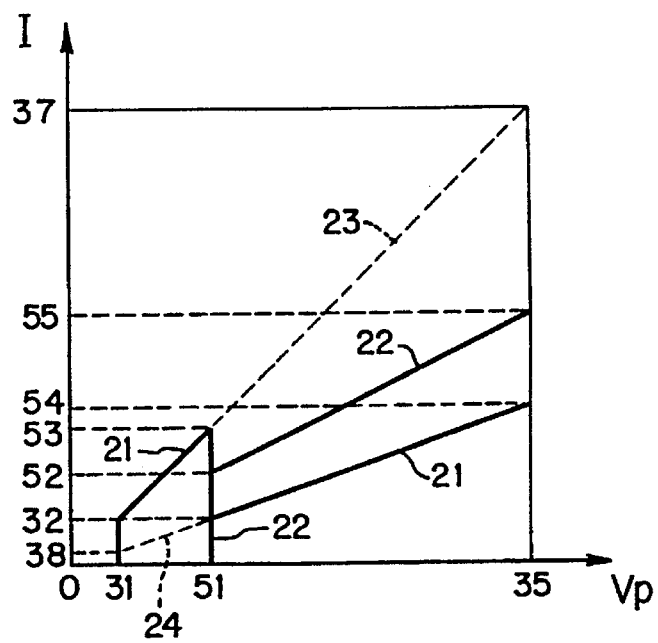
FIG. 5 is a graph showing the relation between a voltage amplitude in an output terminal and an output current of a constant current source in the circuit of FIG. 4.
Figure 6:
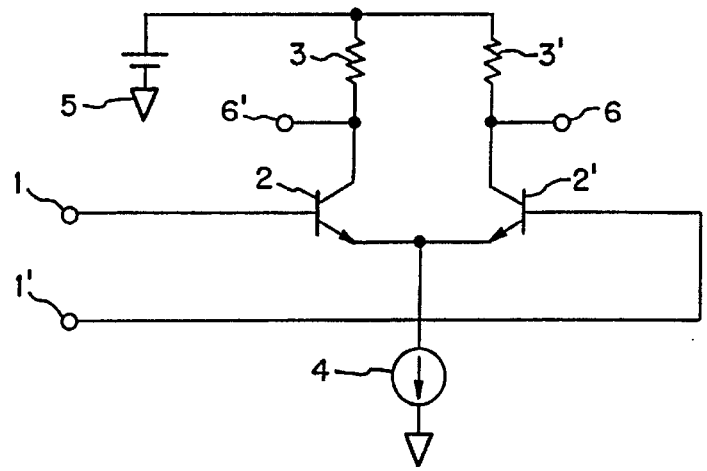
FIG. 6 is a circuit diagram of a prior art amplitude variable type differential amplifier.

The relation between the output amplitude $V_P$ at the output terminals 6 and 6' of the differential amplifier of FIG. 4 and the output current values $I_{E1}$ and $I_{E2}$ of the constant current sources 4a and 4b is shown in FIG. 5. In FIG. 5, numerals which are the same as those in FIG. 2 are denoted at the same numerals. A value which is three times as large as 31, 52 is a value which is twice as large as 32, 53 is a value which is three times as large as 32, 54 is the maximum value of the current flowing in the transistors, and at 55 is a value which is twice as large as 54.

The second constant current source 4b in FIG. 4 is turned off, namely, the equation of $I_{E2}=0$ is established, and the current having the current value 32, i.e. $I_{E1}$ establishing the equation of $I_{E0}=V_{P0}/R_C$ flows in the constant current source 4a in order to set a desired output amplitude $V_P$ to 31 in FIG. 5, i.e. the minimum value $V_{P0}$. As a result, the current does not flow in the transistors 2b, 2b', 2c and 2c' but it flows only in the transistors 2a and 2a'. This state is the same as that of the first embodiment. Accordingly, the amount of current flowing in a single transistor is made large, thereby reducing the decrease of the operating speed of the transistor compared with the same current value 38 if applied in the prior art circuit.

Further, if the desired output amplitude $V_P$ is made larger so that the output current 21 of the constant current source 4a, i.e. output current value $I_{E1}$ reaches the current value 53, i.e. $3I_{E0}$, the output current 21 of the constant current source 4a, i.e. $I_{E1}$ is set to have the current value 32, i.e. $I_{E1}$ establishing the equation of $I_{E2}=I_{E0}$. Since the current of the second constant current source 4b is divided and flows in two transistors 2b and 2c or the transistors 2b' and 2c' respectively connected in parallel with each other, so that the current having the value $I_{E0}$ flows in all the transistors.

Further, if the desired output amplitude $V_P$ is made further larger, the output currents 21 and 22 are set to have a value establishing the equation of $I_{E1}=V_P/R_C/3$, $I_{E2}=2\times V_P/R_C/3$ which is kept until they reach the maximum output amplitude value 35, i.e. $V_{Pm}$. This state is the same as the first embodiment described above. That is, the current flowing in the transistors which are not connected in parallel with each other becomes one third of the value 23 of the current flowing in the single transistor, namely, it becomes a fractional of the value of the current flowing in the transistors which are connected in parallel with each other.

In the differential amplifier according to the second embodiment as shown in FIG. 4, the operation for varying the amplitude at the output terminals 6 and 6' from 0.5 V to 5 V will be now described in detail. In FIG. 4, suppose that the ECL level logical signal is applied to the input terminal 1 and 1', and the load resistors 3 and 3' have resistance value 100Ω and the power source 5 has a voltage value +5 V. In FIG. 5, denoted at 31 is an output amplitude 0.5 V, at 32 is a current value 5 mA, at 35 is an output amplitude 5 V, at 37 is a current value 50 mA, at 51 is an output amplitude 1.5 V, at 52 is a current value 10 mA, at 53 is a current value 15 mA, at 54 is a current value 16.67 mA, and at 55 is a current value 33.33 mA.

The second constant current source 4b is turned off, namely, it is set to have a current value 0A and the constant current source 4a is set to 32, i.e. having 5 mA current in order to set the amplitude at the output terminals 6 and 6' to 31, i.e. 0.5 V. At the same time, the transistors 2b and 2b', 2c and 2c' are turned off. Supposing that the H level voltage is applied to the positive-phase input terminal 1 and the L level voltage is applied to the negative-phase input terminal 1', the transistors 2b, 2b', 2c, and 2c' are turned off as described above, and a base terminal of the transistor 2a has the L level voltage applied thereto turned off, and a base terminal of transistor 2a has the H level voltage applied thereto turned on.

As a result, all the current flowing in the constant current source 4a flows in the load resistor 3. Accordingly, 5 V is obtained at the output terminal 6, the voltage value expressed by 5–100×5 mA =4.5 V is obtained at the output terminal 6'. If the H level input voltage is inverted with the L level input voltage, the output voltage is also inverted, so that 4.5 V is obtained at the output terminal 6 and 5 V is obtained at the output terminal 6', so that the output amplitude has a value expressed by 5–4.5=0.5 V.

The constant current source 4a is set to 54, i.e. having 16.67 mA current and the constant current source 4b is set to 55, i.e. having 33.33 mA in order to set the amplitude at the output terminals 6 and 6' to 35, i.e. 5 V. Supposing that the H level voltage is applied to the positive-phase input terminal 1 and the L level voltage is applied to the negative-phase input terminal 1', the transistors 2a', 2b' and 2c' base terminals of which the L level voltage is applied to are turned off, and the transistors 2a, 2b and 2c base terminals of which the H level voltage is applied to are turned on.

Accordingly, the current which is obtained by adding the current flowing from the transistor 2a to the constant current source 4a, to the current flowing from the transistors 2b and 2c to the constant current source 4b' flows in the load resistor 3. As a result, 5 V is obtained at the output terminal 6, and the voltage value expressed by 5–100×(16.67 mA+33.33 mA)=0 V is obtained at the output terminal 6'. Further, if the H level input voltage is inverted with the L level input voltage, the output voltage is also inverted with each other, so that 0V is obtained at the output terminal 6, and 5V is obtained at the output terminal 6', whereby the output amplitude has a value expressed by 5–0=5 V.

In the differential amplifier according to the first embodiment in FIG. 1, there is a drawback in that the constant current sources are required by the number of parallel connections of the transistors, and the circuit configuration is made large-scale. However, in the differential amplifier according to the second embodiment in FIG. 4, the circuit configuration can be made small since the number of constant current sources is less than the number of paired connections of the transistors.

Although the transistors of the present invention are formed of npn transistors, they may be replaced by pnp transistors or FETs. It is needless to say that the transistors formed of the pnp transistors or the FETs achieve the same effect as the transistors formed of npn transistors.

According to the differential amplifier of the present invention, since the output amplitude of the differential amplifier can be varied by controlling the current values of the first and second constant current sources, it is possible to structure the high speed variable amplitude type differential amplifier which has a large the variable range of the output amplitude thereof.

What is claimed is:

1. A differential amplifier comprising:

a first switching element having an input terminal, an output terminal and a control terminal;

a second switching element having an input terminal, an output terminal and a control terminal;

a first constant current source connected to output terminals of said first and second switching elements;

a third switching element having an input terminal, an output terminal and a control terminal, wherein said control terminal is connected to said control terminal of said first switching element and said input terminal is connected to said input terminal of said first switching element;

a fourth switching element having an input terminal, an output terminal and a control terminal, wherein said control terminal is connected to said control terminal of said second switching element and said input terminal is connected to said input terminal of said second switching element;

resistors connected between said input terminals of said first and second switching elements and a voltage source;

a second constant current source connected to output terminals of said third and fourth switching elements; and an amplitude control circuit connected to said first and second constant current sources for asymmetrically varying the current of said first and second constant current sources in response to an amplitude control input signal so as to control the gain of the differential amplifier.

2. A differential amplifier according to claim 1, wherein said current of said first and second constant current sources are independently controlled to create a predetermined output amplitude of said differential amplifier.

3. A differential amplifier according to claim 1, wherein said first, second, third and fourth switching elements are respectively transistors.

4. A differential amplifier according to claim 2, wherein said first, second, third and fourth switching elements are respectively transistors.

5. A differential amplifier according to claim 1, wherein said first and second switching elements are plural in number.

6. A differential amplifier according to claim 2, wherein said first and second switching elements are plural in number.

7. A differential amplifier according to claim 3, wherein said first and second switching elements are plural in number.

8. A differential amplifier according to claim 4, wherein said first and second switching elements are plural in number.

9. A differential amplifier according to claim 1, wherein said third and fourth switching elements are plural in number.

10. A differential amplifier according to claim 2, wherein said third and fourth switching elements are plural in number.

11. A differential amplifier according to claim 3, wherein said third and fourth switching elements are plural in number.

12. A differential amplifier according to claim 4, wherein said third and fourth switching elements are plural in number.

13. A variable gain differential amplifier, comprising:

a first transistor having an emitter, a base and a collector;

a second transistor having an emitter, a base, and a collector, said emitter of said second transistor being connected to said emitter of said first transistor;

a first constant current source connected to said emitters of said first and second transistors;

a third transistor having an emitter, a base, and a collector, said base and collector of said third transistor being respectively connected to said base and collector of said first transistor;

a fourth transistor having an emitter, a base, and a collector, said base and collector of said fourth transistor being respectively connected to said base and collector of said second transistor, said emitter of said fourth transistor being connected to said emitter of said third transistor;

a second constant current source connected to said emitters of said third and fourth transistors;

a first resistor connecting said collectors of said first and third transistors to a voltage source;

a second resistor connecting said collectors of said second and fourth transistors to said voltage source;

means for applying a first input signal to said bases of said second and fourth transistors;

means for applying a second input signal to said bases of said first and third transistors; and an amplitude control circuit connected to said first and second constant current sources for individually and asymmetrically varying current flow from said first and second current sources so as to control the gain of the differential amplifier in response to an amplitude control signal.

* * * * *